(12) United States Patent
Kim et al.

(10) Patent No.: US 12,289,981 B2
(45) Date of Patent: Apr. 29, 2025

(54) FOLDABLE DISPLAY DEVICE

(71) Applicant: LG Display Co., Ltd., Seoul (KR)

(72) Inventors: TaeWoo Kim, Paju-si (KR); Jungkyu Park, Seoul (KR); SangJun Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 631 days.

(21) Appl. No.: 17/501,719

(22) Filed: Oct. 14, 2021

(65) Prior Publication Data
US 2022/0209145 A1      Jun. 30, 2022

(30) Foreign Application Priority Data
Dec. 30, 2020   (KR) .................. 10-2020-0187224

(51) Int. Cl.
| | |
|---|---|
| *H10K 77/10* | (2023.01) |
| *B32B 3/02* | (2006.01) |
| *B32B 3/30* | (2006.01) |
| *B32B 15/04* | (2006.01) |
| *B32B 15/08* | (2006.01) |
| *H10K 102/00* | (2023.01) |

(52) U.S. Cl.
CPC .............. *H10K 77/111* (2023.02); *B32B 3/02* (2013.01); *B32B 3/30* (2013.01); *B32B 15/043* (2013.01); *B32B 15/08* (2013.01); *B32B 2457/206* (2013.01); *H10K 2102/311* (2023.02)

(58) Field of Classification Search
CPC ............ H10K 77/111; H10K 2102/311; H10K 59/87; H10K 50/84; B32B 3/02; B32B 3/30; B32B 15/043; B32B 15/08; B32B 2457/206; B32B 2255/10; B32B 2307/546; B32B 3/263; B32B 3/266; B32B 15/06; B32B 15/09; B32B 15/18; B32B 15/20; B32B 25/20; B32B 27/08; B32B 27/302; B32B 27/306; B32B 27/308; B32B 27/36; B32B 27/365; B32B 27/40; B32B 27/281; G09F 9/301; G06F 1/1652

See application file for complete search history.

(56) References Cited

U.S. PATENT DOCUMENTS

| | | | | |
|---|---|---|---|---|
| 10,976,873 | B2* | 4/2021 | Shin | H04M 1/0268 |
| 2018/0351117 | A1* | 12/2018 | Kim | H10K 71/00 |
| 2020/0411777 | A1* | 12/2020 | Seo | G06F 1/1652 |
| 2021/0255664 | A1* | 8/2021 | Nam | G02B 5/005 |
| 2022/0011815 | A1* | 1/2022 | Min | G06F 1/1637 |
| 2022/0071026 | A1* | 3/2022 | Ha | B32B 7/05 |
| 2022/0114923 | A1* | 4/2022 | Ha | G06F 1/1616 |
| 2022/0155821 | A1* | 5/2022 | Kim | G06F 1/1618 |

(Continued)

FOREIGN PATENT DOCUMENTS

| | | |
|---|---|---|
| CN | 106486491 A | 3/2017 |
| CN | 110649087 A | 1/2020 |

(Continued)

*Primary Examiner* — Ricardo Osorio
(74) *Attorney, Agent, or Firm* — Birch, Stewart, Kolasch & Birch, LLP

(57) ABSTRACT

In a foldable display device, stretchability is given to an outermost area of the folding area of the first support substrate to which a relatively high stress is applied. Thus, the folding radius at the outermost area increases, which relatively reduces the stress at the outermost area. Accordingly, it is possible to suppress occurrence of cracks in the outermost area.

16 Claims, 11 Drawing Sheets

(56) References Cited

U.S. PATENT DOCUMENTS

2023/0087236 A1\* 3/2023 Han .................. G06F 1/1681
　　　　　　　　　　　　　　　　　　　　345/173
2023/0154361 A1\* 5/2023 Ha .................... G06F 1/1616
　　　　　　　　　　　　　　　　　　　　361/679.01

FOREIGN PATENT DOCUMENTS

| CN | 111081150 A | \* | 4/2020 | ............ G09F 9/301 |
| CN | 111508371 A | | 8/2020 | |
| CN | 112133196 A | | 12/2020 | |
| EP | 3771186 A1 | \* | 1/2021 | ........... G06F 1/1616 |
| EP | 3982231 A1 | \* | 4/2022 | ........... G06F 1/1616 |
| KR | 20180121256 A | \* | 11/2018 | |
| KR | 10-2019-0003257 A | | 1/2019 | |
| KR | 20190003257 A | \* | 1/2019 | |
| KR | 10-2020-0052621 A | | 5/2020 | |
| KR | 102392468 B1 | \* | 4/2022 | |
| WO | WO-2020177517 A1 | \* | 9/2020 | ......... H01L 51/0097 |
| WO | WO 2020/222445 A1 | | 11/2020 | |

\* cited by examiner

FOLDABLE DISPLAY DEVICE

CROSS-REFERENCE TO RELATED APPLICATIONS

This application claims priority to Korean Patent Application No. 10-2020-0187224 filed in the Republic of Korea on Dec. 30, 2020, the entire contents of which are hereby expressly incorporated herein by reference into the present application.

BACKGROUND

Field

The present disclosure relates to a foldable display device, and more particularly, to a foldable display device capable of suppressing occurrence and propagation of cracks caused by repeated folding while the display device is being folded and unfolded.

Description of the Related Art

Recently, as the information age progresses, display devices for processing and displaying a large amount of information have been rapidly developed. Display devices employed by the monitor of a computer, a TV, a mobile phone or the like include an organic light emitting display (OLED) that emits light by itself, and a liquid crystal display (LCD) that uses a separate light source.

As the display devices have been increasingly applied to diverse fields such as a computer monitor, a TV, and a personal mobile device, display devices having a large display area and a reduced volume and weight have been studied.

Particularly, recently, a flexible display device manufactured to display images even when it is bent or folded like paper has attracted attention as the next-generation display device. The flexible display device uses a thin film transistor substrate made of plastic instead of glass, and can be categorized into an unbreakable display of a high durability, a bendable display to be bent without being broken, a rollable display, a foldable display, and the like. The flexible display device has advantages in use of space, interior decoration and design, and can be applied in various fields.

SUMMARY OF THE DISCLOSURE

An object to be achieved by the present disclosure is to provide a foldable display device capable of suppressing occurrence of cracks in a portion to which a relatively high stress is applied.

Another object to be achieved by the present disclosure is to provide a foldable display device with improved folding reliability.

Objects of the present disclosure are not limited to the above-mentioned objects, and other objects, which are not mentioned above, can be clearly understood by those skilled in the art from the following descriptions.

According to an aspect of the present disclosure, the foldable display device includes a display panel including a display area and a non-display area surrounding the display area, where a folding area is defined in the display area and the non-display area, and non-folding areas are defined on both sides of the folding area.

The foldable display device also includes a first support substrate disposed under the display panel to support the display panel and including a plurality of openings disposed in an area corresponding to the non-display area of the folding area. The foldable display device further includes a second support substrate disposed under the first support substrate. A width of the plurality of openings in an extension direction of a folding axis of the folding area is greater than a width of the plurality of openings in a direction perpendicular to the extension direction of the folding axis.

Therefore, stretchability is given to an outermost area of the folding area of the first support substrate to which a relatively high stress is applied. Thus, a folding radius at the outermost area increases, which relatively reduces the stress at the outermost area. Accordingly, it is possible to suppress occurrence of cracks in the outermost area.

Other detailed matters of the exemplary embodiments are included in the detailed description and the drawings.

According to the present disclosure, it is possible to give stretchability to an outer area of a display device to which a relatively high stress is applied.

Further, according to the present disclosure, it is possible to increase a folding radius and thus it is possible to reduce a folding stress and improve folding reliability.

Further, according to the present disclosure, it is possible to reduce the possibility of occurrence of cracks in an outer area of a display device by making the thickness of an edge area smaller than the thickness of a central area and thus suppressing stress concentration in the outer area.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
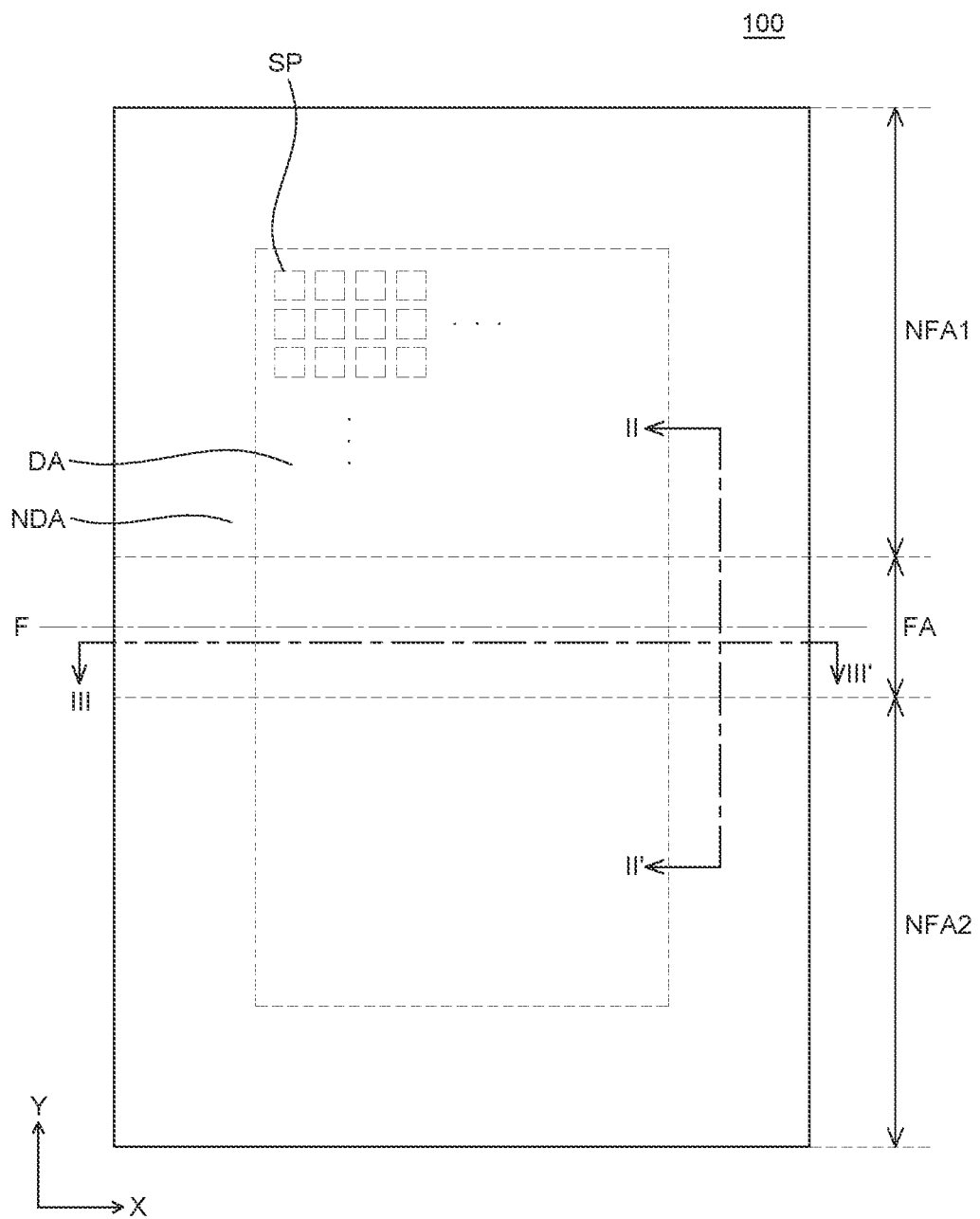
FIG. 1 is a schematic plan view of a foldable display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components and may not define order. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, various exemplary embodiments of the present disclosure will be described in detail with reference to the accompanying drawings.

Figure 2:
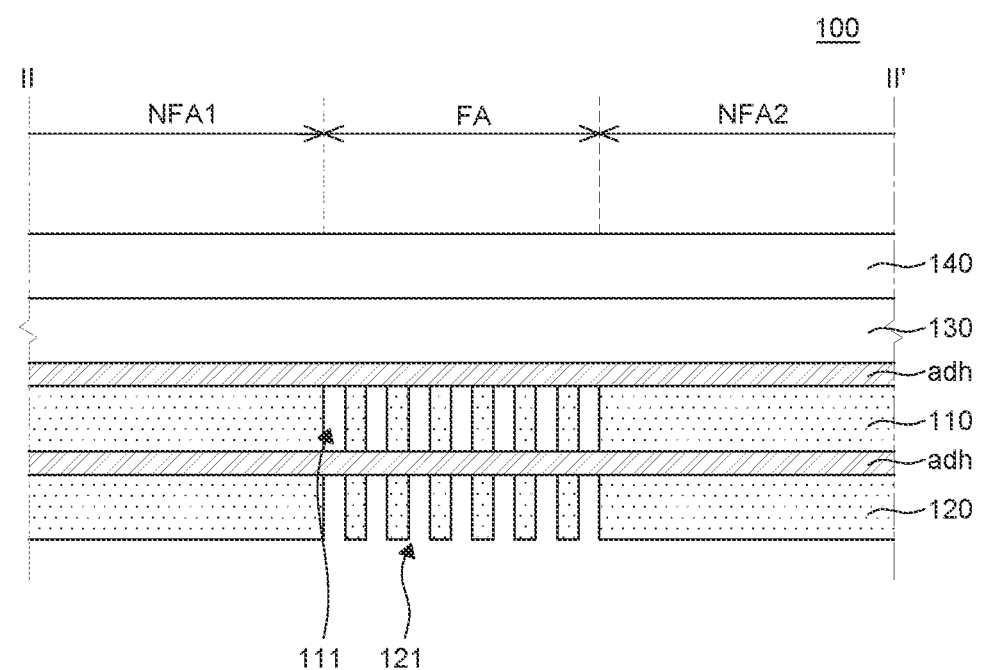
FIG. 2 is a schematic cross-sectional view of the foldable display device as taken along a line II-II' of FIG. 1.
Figure 3:
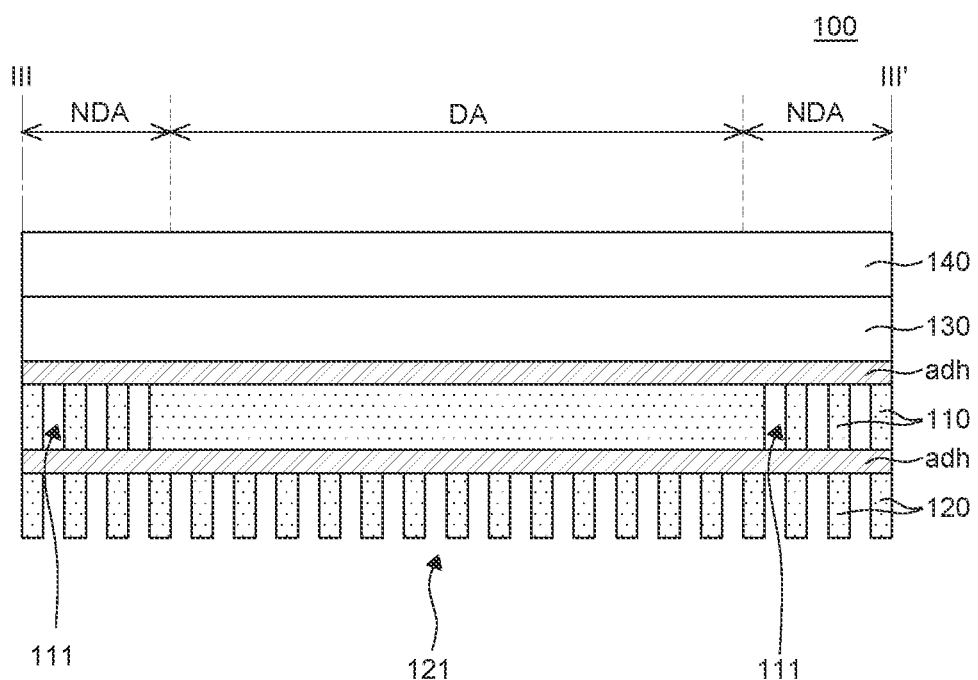
FIG. 3 is a schematic cross-sectional view of the foldable display device as taken along a line III-III' of FIG. 1.

FIG. 1 is a schematic plan view of a foldable display device according to an exemplary embodiment of the present disclosure. FIG. 2 is a schematic cross-sectional view of the foldable display device as taken along a line II-II' of FIG. 1. FIG. 3 is a schematic cross-sectional view of the foldable display device as taken along a line III-III' of FIG. 1. All the components of each foldable display device according to all embodiments of the present disclosure are operatively coupled and configured.

Referring to FIG. 1 through FIG. 3, a foldable display device 100 according to an exemplary embodiment of the present disclosure includes a first support substrate 110, a second support substrate 120, a display panel 130 and a cover window 140. Hereinafter, for the convenience of description, the foldable display device 100 according to an exemplary embodiment of the present disclosure will be described as an organic light emitting display device, but is not limited thereto.

Referring to FIG. 1, a display panel included in the foldable display device 100 includes a display area DA and a non-display area NDA. Further, the display panel includes a folding area FA and non-folding areas NFA1 and NFA2. The display panel can be divided into the display area DA and the non-display area NDA depending on whether an image is displayed. The display panel can be divided into the folding area FA, and the non-folding areas NFA1 and NFA2 on both sides of the folding area FA depending on the possibility of being folded.

The display area DA is an area where a plurality of pixels is disposed and images are displayed. In the display area DA, a plurality of pixels each including an emission area for displaying images, a thin film transistor for driving the pixels, a capacitor and the like can be disposed. Each pixel can include a plurality of sub-pixels SP.

Each sub-pixel SP is a minimum unit for configuring a display area and can be configured to emit light of a specific wavelength band. For example, each sub-pixel SP can be configured to emit red, green, blue or white light. The non-display area NDA is located to surround the display area DA. The non-display area NDA is an area where images are not displayed.

In the non-display area NDA, various lines, driver ICs, printed circuit boards, and the like for driving the pixels and driving circuits disposed in the display area DA are disposed. For example, in the non-display area NDA, various ICs, such as a gate driver IC and a data driver IC, VSS lines, and the like can be disposed.

As described above, the display panel can be divided into the folding area FA and the non-folding areas NFA1 and NFA2 depending on the possibility of being folded. The display panel according to an exemplary embodiment of the present disclosure includes the first non-folding area NFA1, the folding area FA and the second non-folding area NFA2 disposed in sequence along a direction, i.e., Y-axis direction, perpendicular to a folding axis F of the folding area.

The folding area FA is folded when the foldable display device 100 is folded, and can include a part of the display area DA and a part of the non-display area NDA. The folding area FA can be folded with a specific folding radius in the direction, i.e., Y-axis direction in FIG. 1, perpendicular to the folding axis F of the folding area. When the folding area FA is folded in the direction perpendicular to the folding axis F, the folding area FA can form a part of a circle or oval. Here, the folding radius of the folding area FA refers to the radius of the circle or oval formed by the folding area FA.

The first non-folding area NFA1 and the second non-folding area NFA2 are not folded when the foldable display device 100 is folded. For example, each of the first non-folding area NFA1 and the second non-folding area NFA2 maintains a flat state when the foldable display device 100 is folded. Each of the first non-folding area NFA1 and the second non-folding area NFA2 can include a part of the display area DA and a part of the non-display area NDA. When the folding area FA is folded in a folding direction, the first non-folding area NFA1 and the second non-folding area NFA2 can overlap each other.

The display panel 130 is a panel in which images are implemented. In the display panel 130, display elements for implementing images and circuit units for driving the display elements can be disposed. For example, if the foldable display device 100 is an organic light emitting display device, the display elements can include organic light emitting elements.

A circuit unit can include various thin film transistors, a capacitor, a line and a driver IC for driving organic light emitting elements. For example, the circuit unit can include various elements such as a driving thin film transistor, a switching thin film transistor, a storage capacitor, a gate line, a data line, a gate driver IC and a data driver IC. However, the present disclosure is not limited thereto.

The display panel 130 is manufactured by encapsulating a flexible substrate by an encapsulation unit. On the flexible substrate, a driving thin film transistor and light emitting elements are formed. The display panel 130 includes the flexible substrate, which has a very small thickness to achieve flexibility, and display elements disposed on the flexible substrate.

The flexible substrate can be made of an insulating material having flexibility. For example, the flexible substrate can be a substrate made of insulating plastic selected from polyimide, polyethersulfone, polyethylene terephthalate and polycarbonate.

A plastic substrate has relatively weak barrier properties to moisture or oxygen. To make up for this, the flexible substrate can have a structure in which a plastic film and an inorganic film are laminated. For example, the flexible substrate can have a multilayered structure in which a first plastic film, an inorganic film and a second plastic film are laminated in sequence, but is not limited thereto.

On the flexible substrate, a driving thin film transistor for a driving display element can be disposed. The driving thin film transistor can be disposed in each of a plurality of pixel areas. For example, the driving thin film transistor includes a gate electrode, an active layer, a source electrode and a drain electrode. Further, the driving thin film transistor can include a gate insulating layer for insulating the gate electrode from the active layer. Further, the driving thin film transistor can include an interlayer insulating layer for insulating the gate electrode from the source electrode and the drain electrode. On the driving thin film transistor, a planarization layer for planarizing an upper surface can be disposed.

The display element can be disposed on the planarization layer. The display element can be an organic light emitting element. The organic light emitting element can include an anode, a cathode and an organic emission layer disposed between the anode and the cathode. The organic light emitting element emits light by combining holes injected from the anode with electrons injected from the cathode in the organic emission layer. In this way, an image can be displayed using the emitted light.

The flexible substrate has excellent folding properties but has a small thickness and a lower stiffness than a glass substrate or a metallic substrate. Thus, the flexible substrate may not maintain a uniform shape when folded, which can cause sagging. Therefore, to support the flexible substrate and improve an impact resistance, the first support substrate 110 and the second support substrate 120 are disposed under the display panel 130.

The first support substrate 110 and the second support substrate 120 disposed under the display panel 130 can support the display panel 130 to suppress sagging or deformation. Further, the first support substrate 110 and the second support substrate 120 protect the display panel 130 against external impact or impurities.

The first support substrate 110 can be referred to as a top plate. The first support substrate 110 can enhance the stiffness of the display panel 130 and function to suppress recognition of a plurality of patterns 121 formed in the second support substrate 120 through the display panel 130.

The first support substrate 110 can be made of an amorphous metal. The amorphous metal is a solid metallic material in which atoms are disposed in a disordered manner like glass or liquid, and is produced when crystal growth is inhibited through rapid quenching of metallic materials. The amorphous metal is excellent in corrosion resistance and elasticity as compared with a crystalline metal which generally has atoms disposed in an ordered manner. For example, the first support substrate 110 can contain any one amorphous metal selected from the group consisting of nickel, iron, cobalt, palladium, silicon, magnesium, zirconium, titanium, calcium, copper, platinum, gold and combinations thereof.

If the first support substrate 110 is made of the amorphous metal, cracks can occur in an outermost area of the first support substrate 110 to which a relatively high stress is applied to the outermost area when the first support substrate 110 is repeatedly folded. This is because the amorphous metal has an excellent elasticity but shows brittleness with a high hardness.

Thus, referring to FIG. 2 and FIG. 3, in an exemplary embodiment of the present disclosure, a plurality of openings 111 is disposed in an area corresponding to an outer area of the first support substrate 110, i.e., the non-display area NDA of the folding area FA. The plurality of openings can suppress occurrence and propagation of cracks caused by stress concentration in the outer area of the first support substrate 110. The plurality of openings of the first support substrate 110 will be described in more detail later.

The second support substrate 120 can be referred to as a bottom plate. The second support substrate 120 can include the plurality of patterns 121 formed corresponding to the folding area FA of the foldable display device 100. Due to the plurality of patterns 121 formed in the folding area FA, an elasticity change section is increased, which makes it possible to fold or unfold the foldable display device 100.

The second support substrate 120 can be made of stainless steel (SUS), SUS containing a metal such as nickel (Ni), or a metal material such as iron (Fe), aluminum (Al) or magnesium (Mg). Preferably, the second support substrate 120 can be made of SUS. For example, SUS has high restoring force and high stiffness, and, thus, the second support substrate 120 can maintain a high stiffness even when its thickness is decreased. Therefore, the second support substrate 120 supports the display panel 130 and reduces the overall thickness of the foldable display device 100, which results in a decrease in the folding radius of the folding area. However, the present disclosure is not limited thereto. The second support substrate 120 can be made of a polymer such as polymethylmethacrylate (PMMA), polycarbonate (PC), polyvinylalcohol (PVA), acrylonitrile-butadiene-styrene (ABS), polyethylene terephthalate (PET), silicone or polyurethane (PU).

In some exemplary embodiments, a back plate can be further provided between the display panel 130 and the first support substrate 110. Since the display panel 130 is formed thin, the back plate can be attached to a rear surface of the display panel 130 to further support the display panel 130. The back plate is disposed between the display panel 130 and the first support substrate 110. Thus, the back plate can suppress a transfer or distortion of the display screen caused by the plurality of patterns 121 formed in the second support substrate 120.

For example, the back plate can be made of a polymer such as polyimide (PI), polymethylmethacrylate (PMMA), polycarbonate (PC), polyvinylalcohol (PVA), acrylonitrile-butadiene-styrene (ABS), polyethylene terephthalate (PET), silicone or polyurethane (PU) and can support the display panel 130.

Further, the cover window 140 is disposed on the display panel 130. The cover window 140 protects the display panel 130 against external impact and scratch. Thus, the cover window 140 can be made of a material that is transparent and excellent in impact resistance and scratch resistance. Further, the cover window 140 protects the display panel 130 against moisture permeating from the outside.

The cover window 140 can be configured as a cover of a flexible plastic type that can be folded for thinness and flexibility of the foldable display device 100. For example, the cover window 140 can be a film made of a polymer such as polyimide, polyamide imide, polyethylene terephthalate, polymethylmethacrylate, polypropylene glycol or a polycarbonate. As another example, the cover window 140 can be a film made of an optically-isotropic polymer such as a cyclo-olefin (co)polymer, optically-isotropic polycarbonate or optically-isotropic polymethylmethacrylate.

Further, various functional layers can be laminated on the cover window 140. For example, various functional layers such as an external light reflection reducing layer, a UV blocking layer, a hard coating layer, etc. can be disposed on the cover window 140, but the present disclosure is not limited thereto.

Hereinafter, the first support substrate 110 will be described in detail with reference to FIG. 4.

Figure 4:
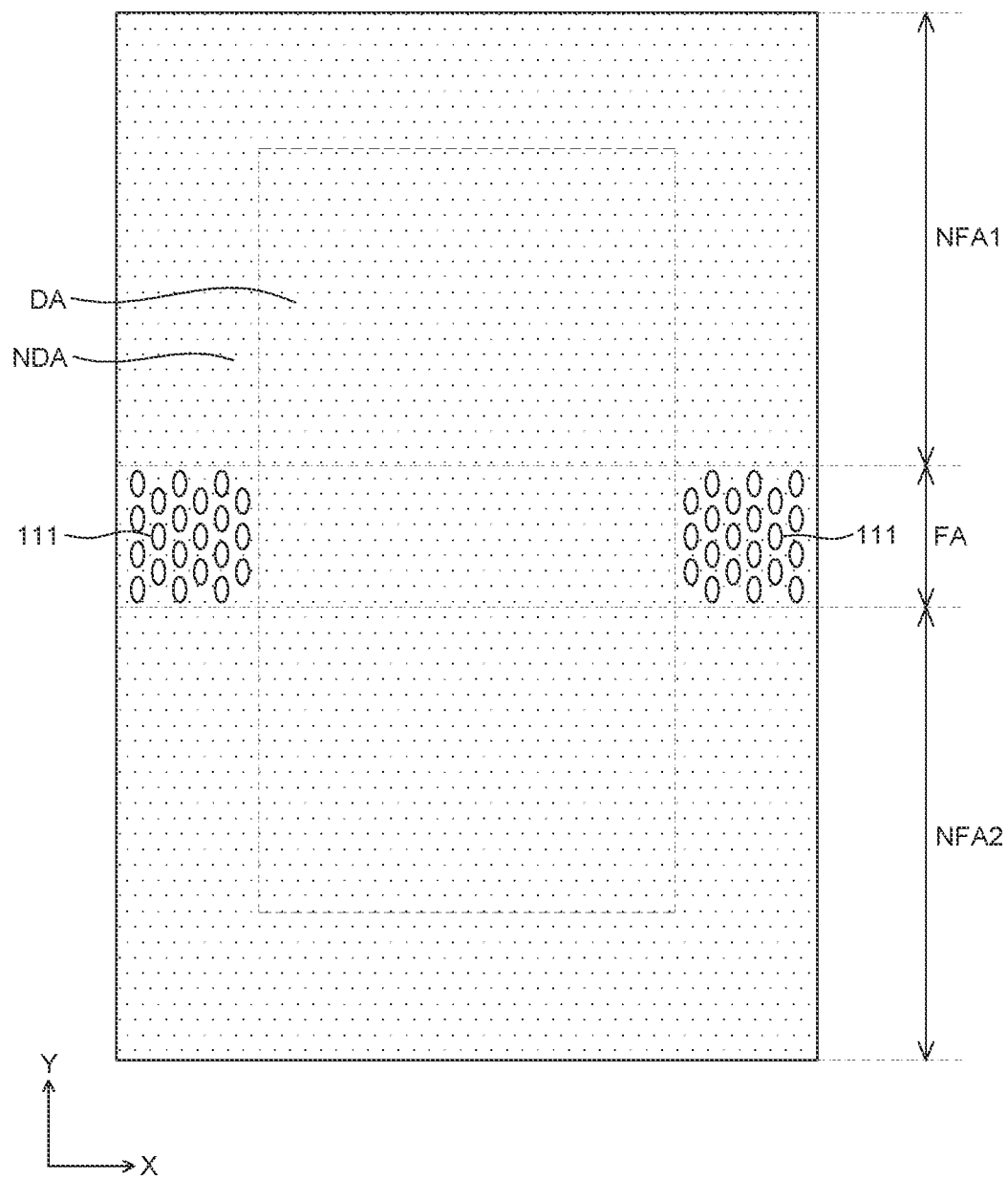
FIG. 4 is a schematic plan view of a first support substrate according to an exemplary embodiment of the present disclosure.

FIG. 4 is a schematic plan view of a first support substrate of the foldable display device according to an exemplary embodiment of the present disclosure.

Referring to FIG. 4, the first support substrate 110 can include the plurality of openings 111 disposed in an area corresponding to the non-display area NDA of the folding area FA.

A width of the plurality of openings 111 in an extension direction (e.g., X-axis) of the folding axis F of the folding area can be greater than a width of the plurality of openings 111 in a direction (e.g., Y-axis) perpendicular to the extension direction of the folding axis F. For example, the plurality of openings 111 can preferably have an oval shape, but is not limited thereto.

A flexible display device like the foldable display device 100 needs to be folded and unfolded. Therefore, to secure flexibility, the plurality of patterns 121 is formed in the folding area of the second support substrate 120 that supports the display panel 130. Further, to suppress recognition of the plurality of patterns 121 formed in the folding area of the second support substrate 120 through the display panel 130, the first support substrate 110 is disposed between the second support substrate 120 and the display panel 130.

Here, an amorphous metal having an excellent elastic limit can be used as the first support substrate 110. The amorphous metal has higher hardness and brittleness than a crystalline metal. Thus, if a stress is concentrated in the outer area of the first support substrate 110 while the foldable display device 100 is folded and unfolded, cracks can occur in the stress-concentrated area. As a result, the display panel 130 can be degraded in display quality.

Accordingly, in the display device 100 according to an exemplary embodiment of the present disclosure, the plurality of openings 111 is disposed in the area corresponding to the non-display area NDA of the folding area FA of the first support substrate 110. Thus, it is possible to suppress occurrence and propagation of cracks in the first support substrate 110. Specifically, the plurality of openings 111 is formed in the area corresponding to the non-display area NDA of the folding area FA of the first support substrate 110. Thus, stretchability can be given to the outer area of the first support substrate 110. Therefore, a folding shape at the outer area of the first support substrate 110 can be induced close to a circular shape so that a folding radius of the outer area of the first support substrate 110 can be increased. As the folding radius of the outer area of the first support substrate 110 increases, a stress at the outer area of the first support substrate 110 can be dispersed. Accordingly, it is possible to suppress occurrence of cracks in the outer area of the first support substrate 110.

Particularly, the plurality of openings 111 can suppress occurrence of cracks inside the first support substrate 110 as well as at the outer area of the first support substrate 110. For example, if the plurality of openings has a circular shape having the same radius or a polygonal shape having linear edges, a stress can be concentrated in a central area or edge area of each opening. Thus, cracks caused by the plurality of openings 111 can occur inside the first support substrate 110. Therefore, the plurality of openings 111 disposed in the area corresponding to the non-display area NDA of the folding area FA of the first support substrate 110 can preferably have an oval shape.

Therefore, in the display device 100 according to an exemplary embodiment of the present disclosure, the plurality of openings 111 having the above-described shape is formed in the area corresponding to the non-display area NDA of the folding area FA of the first support substrate 110. Thus, a stress concentrated in a specific area of the first support substrate 110 during folding can be dispersed. Accordingly, even if the display device 100 is repeatedly folded, deformation, such as fracture or plastic deformation, does not occur, and, thus, folding reliability can be improved.

Figure 5:
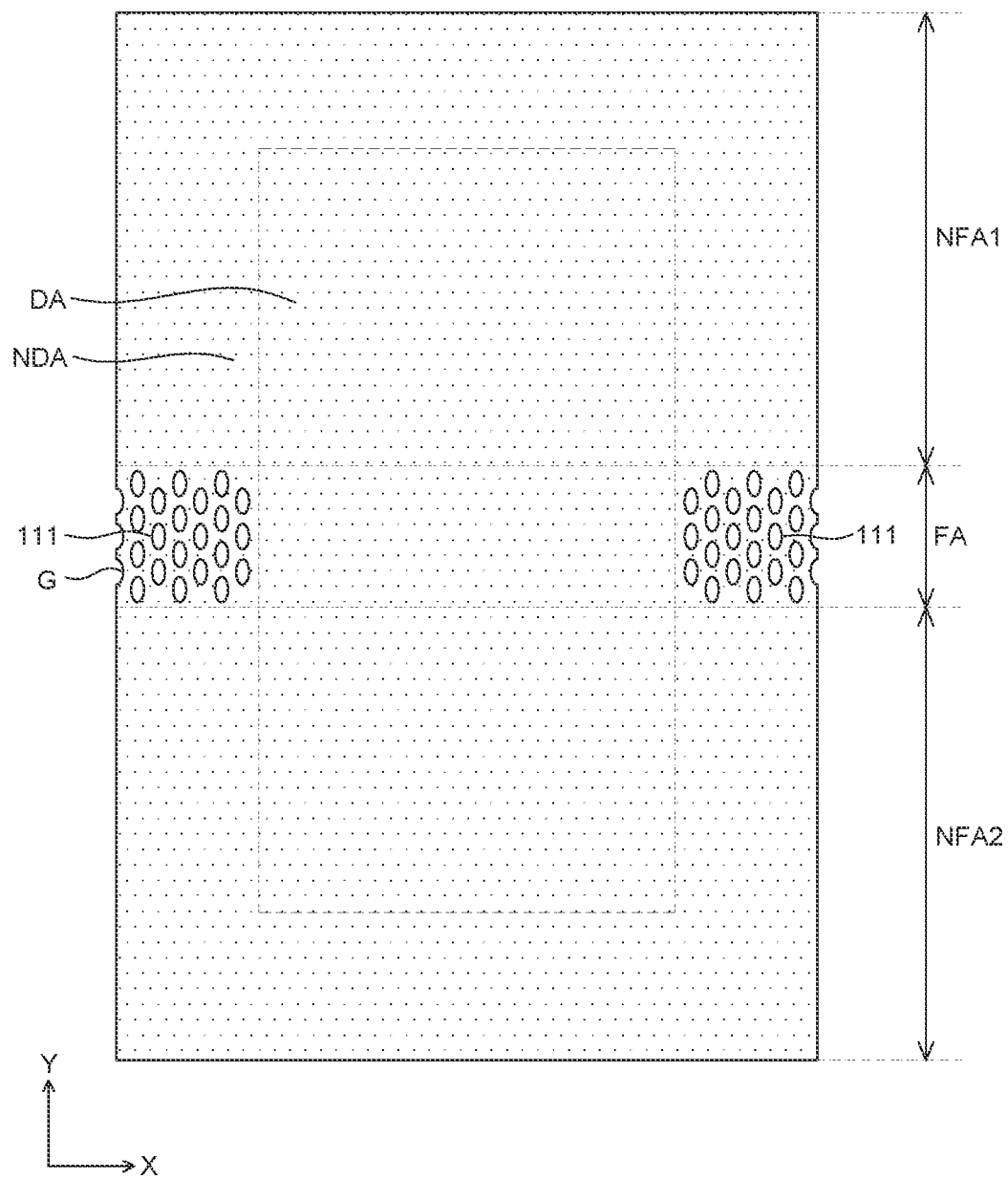
FIG. 5 is a schematic plan view of a first support substrate according to another exemplary embodiment of the present disclosure.

FIG. 5 is a schematic plan view of a first support substrate according to another exemplary embodiment of the present disclosure. A first support substrate 210 shown in FIG. 5 has substantially the same configuration as the support substrate 110 shown in FIG. 1 through FIG. 4 except that a plurality of grooves G recessed inwardly is included in an edge of the non-display area NDA of the folding area FA. Thus, a repeated description will be omitted or may be briefly provided.

Referring to FIG. 5, the first support substrate 210 according to another exemplary embodiment of the present disclosure can include the plurality of grooves G corresponding in shape to the plurality of openings 111. For example, a width of the plurality of grooves G in the extension direction (e.g., X-axis) of the folding axis F of the folding area FA can be greater than a width of the plurality of grooves G in the direction (e.g., Y-axis) perpendicular to the extension direction of the folding axis F.

Since the plurality of grooves G has a shape recessed inwardly in the edge of the non-display area NDA of the folding area FA, an effective length at an edge of the first support substrate 210 can increase. Specifically, the effective length refers to a length at the edge of the folding area FA of the foldable display device 100 in the direction perpendicular to the folding axis F. The effective length is a length over which the foldable display device 100 can be deformed at the edge of the first support substrate 210 when folded.

In the first support substrate 210 according to another exemplary embodiment of the present disclosure, the plurality of grooves G is included in the edge of the first support substrate 210 during folding. Thus, the effective length at the edge of the first support substrate 210 increases. Therefore, a strain at the edge further increases. Accordingly, a folding shape of the first support substrate 210 can be more easily induced close to a circular shape during folding.

Therefore, in the display device 100 according to another exemplary embodiment of the present disclosure, the plurality of grooves G recessed inwardly is included in the edge of the first support substrate 210. Thus, a stress concentrated in an edge area of the first support substrate 110 during folding can be effectively dispersed. Accordingly, even if the display device 100 is repeatedly folded, deformation, such as fracture or plastic deformation, does not occur, and, thus, folding reliability can be further improved.

Figure 6:
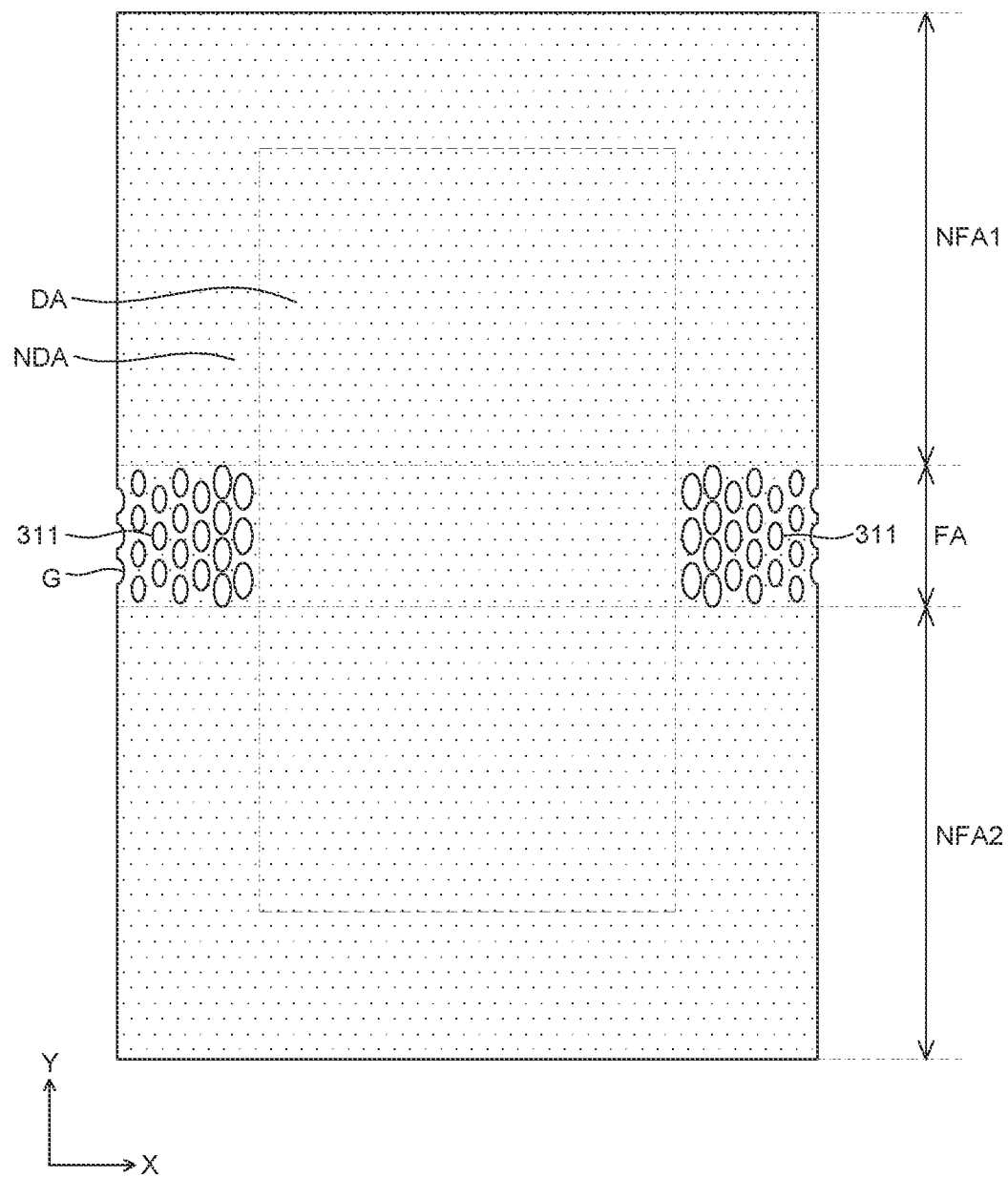
FIG. 6 is a schematic plan view of a first support substrate according to yet another exemplary embodiment of the present disclosure.

FIG. 6 is a schematic plan view of a first support substrate according to yet another exemplary embodiment of the present disclosure.

A first support substrate 310 shown in FIG. 6 has substantially the same configuration as the support substrate 210 shown in FIG. 5 except that a plurality of openings 311 increases in size as a distance to the display area DA decreases. Thus, a repeated description will be omitted or may be briefly provided.

Referring to FIG. 6, the plurality of openings 311 formed in the first support substrate 310 according to another exemplary embodiment of the present disclosure can be different in size depending on the position. Specifically, the plurality of openings 311 formed in the first support substrate 310 increases in size as the distance to the display area DA decreases.

For example, if the first support substrate 310 includes the plurality of grooves G, the plurality of grooves G is formed at an outermost area, i.e., an edge, of the first support substrate 310. Thus, the plurality of grooves G can be smaller in size than the plurality of openings 311 formed inside the non-display area NDA of the folding area FA of the first support substrate 310.

Therefore, in the display device 100 according to yet another exemplary embodiment of the present disclosure, the plurality of openings 311 is formed in the first support substrate 310 to have different sizes depending on the position. Therefore, the plurality of openings 311 makes it easy to disperse a stress around the display area DA. Thus, it is possible to suppress occurrence of cracks around the display area DA. Further, the plurality of openings 311 inhibits propagation of cracks in an outer area of the first support substrate 310 caused by repeated folding. Thus, it is possible to suppress propagation of cracks into the display area DA.

Figure 7A:
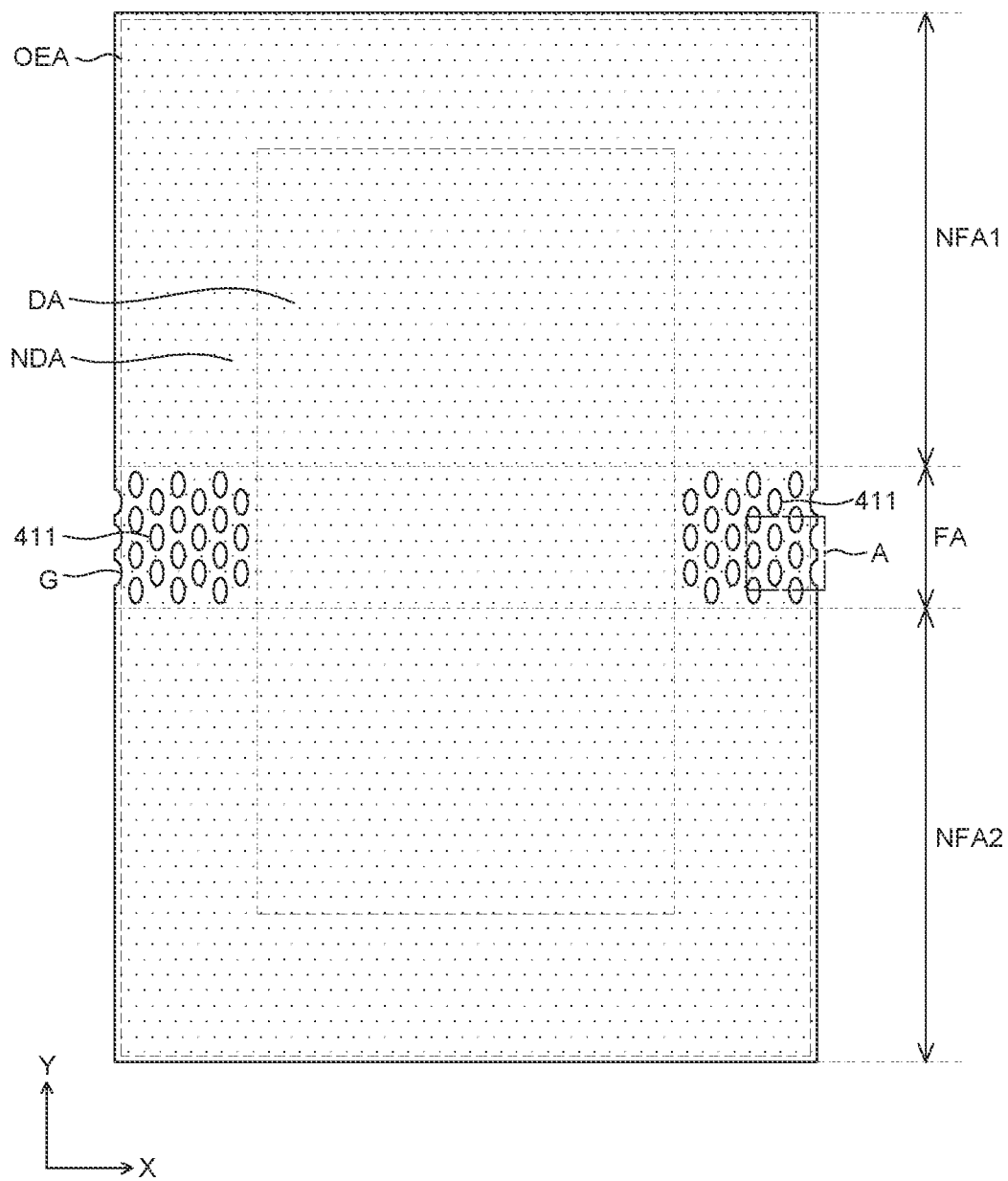
FIG. 7A is a schematic plan view of a first support substrate according to still another exemplary embodiment of the present disclosure.
Figure 7B:
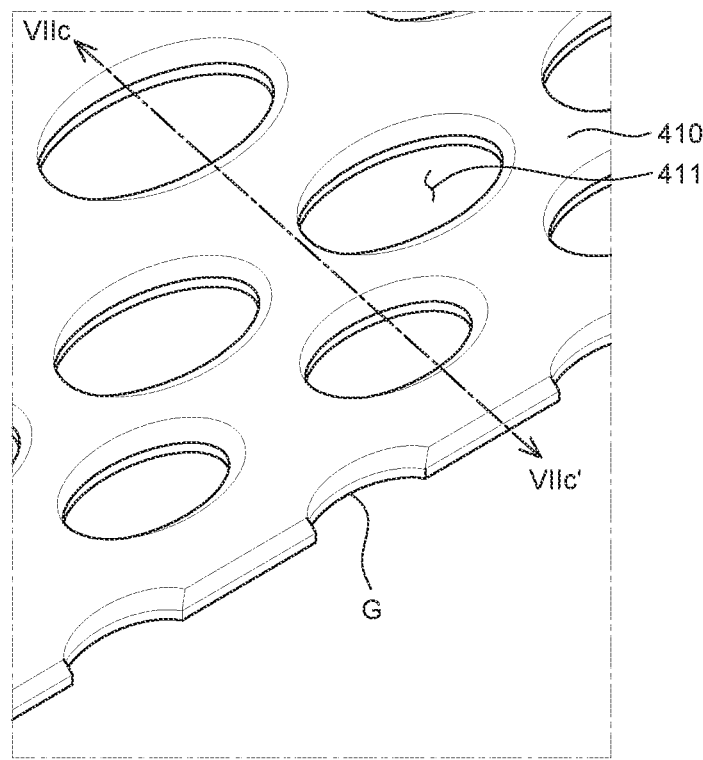
FIG. 7B is an enlarged view of an area A of the first support substrate shown in FIG. 7A.
Figure 7C:
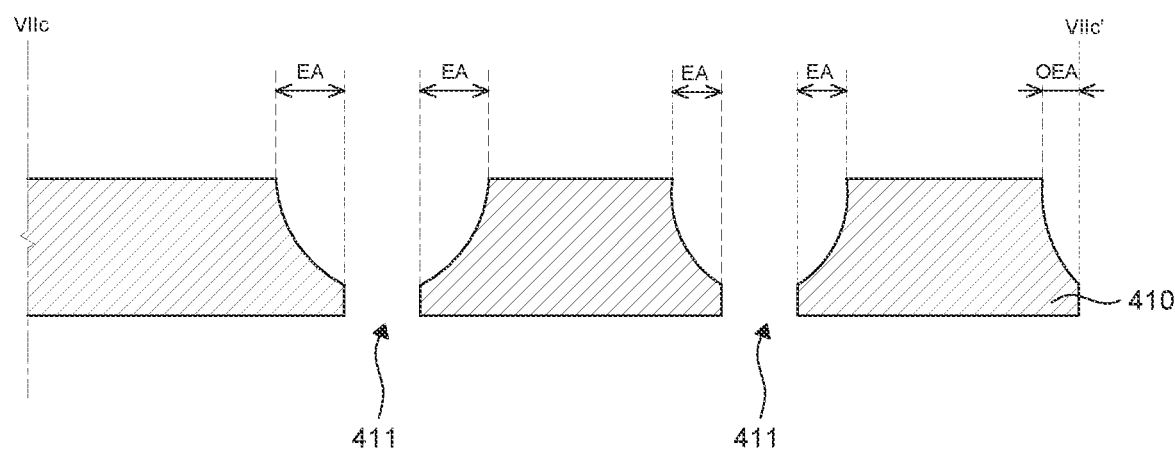
FIG. 7C is a schematic cross-sectional view of the first support substrate as taken along a line VIIc-VIIc' of FIG. 7B.

FIG. 7A is a schematic plan view of a first support substrate according to still another exemplary embodiment of the present disclosure. FIG. 7B is a side enlarged view of an area A of the first support substrate shown in FIG. 7A. FIG. 7C is a schematic cross-sectional view of the first support substrate as taken along a line VIIc-VIIc' of FIG. 7B.

A first support substrate 410 shown in FIG. 7A has substantially the same configuration as the first support substrate 210 shown in FIG. 5 except an edge area OEA corresponding to an outermost area of the first support substrate 410 and different cross-sectional shapes of the edge area OEA and a plurality of openings 411. Thus, a repeated description will be omitted or may be briefly provided.

Referring to FIG. 7A through FIG. 7C, the first support substrate 410 includes a central area (e.g., middle area) corresponding to the display area DA and an outer area corresponding to the non-display area NDA. The outer area corresponding to the non-display area NDA includes the edge area OEA corresponding to the outermost area of the first support substrate 410. Here, a cross-sectional shape of the edge area OEA of the first support substrate 410 can increase in width as it gets closer to a lower surface of the first support substrate 410. Further, the plurality of openings 411 formed in the first support substrate 410 includes an edge area EA, and the edge area EA of the plurality of openings 411 can have a smaller cross-sectional area than the central area of the first support substrate 410.

A cross-sectional shape of the edge area OEA of the first support substrate 410 and a cross-sectional shape of the edge area EA of the plurality of openings 411 can be changed through the same process. For example, a cross-sectional shape of the edge area OEA of the first support substrate 410 and a cross-sectional shape of the edge area EA of the plurality of openings 411 can be changed as described above through an etching process that is not accompanied by high heat generation.

The cross-sectional shape of the edge area OEA of the first support substrate 410 is changed to increase in width as it gets closer to the lower surface of the first support substrate 410. Thus, the edge area OEA of the first support substrate 410 can have a smaller thickness than the central area of the first support substrate 410.

Here, the edge area OEA of the first support substrate 410 refers to a portion of the outermost area of the first support substrate 410 where the width of the lower surface of the first support substrate 410 is changed. For example, the width of the edge area OEA of the first support substrate 410 can be equal to or less than 50% of the thickness of the central area of the first support substrate 410.

Further, the cross-sectional area of the edge area EA of the plurality of openings 411 can be changed to be smaller than the cross-sectional area of the central area of the first support substrate 410. Preferably, a cross-sectional thickness of the edge area EA of the plurality of openings can be equal to or less than 50% of the thickness of the central area of the first support substrate 410.

If the width of the edge area OEA of the first support substrate 410 exceeds the above-described range or the cross-sectional thickness of the edge area EA of the plurality of openings exceeds the above-described range, in the non-display area, to arrange various lines and integrated circuits, the overall area of the non-display area can be undesirably increased.

Therefore, in the display device 100 according to still another exemplary embodiment of the present disclosure, the cross-sectional shape of the edge area OEA of the first support substrate 410 is changed as described above. Thus, it is possible to suppress stress concentration in the outermost area of the first support substrate 410.

Further, the cross-sectional shape of the edge area EA of the plurality of openings 411 is changed as described above. Thus, it is possible to more easily disperse a stress so as to suppress stress concentration in the plurality of openings 411.

Therefore, it is possible to further reduce the possibility of occurrence of cracks inside the first support substrate 410 and in the outer area of the first support substrate 410. Accordingly, even if the display device 100 is repeatedly folded, deformation, such as fracture or plastic deformation, does not occur, and, thus, folding reliability can be further improved.

Figure 8:
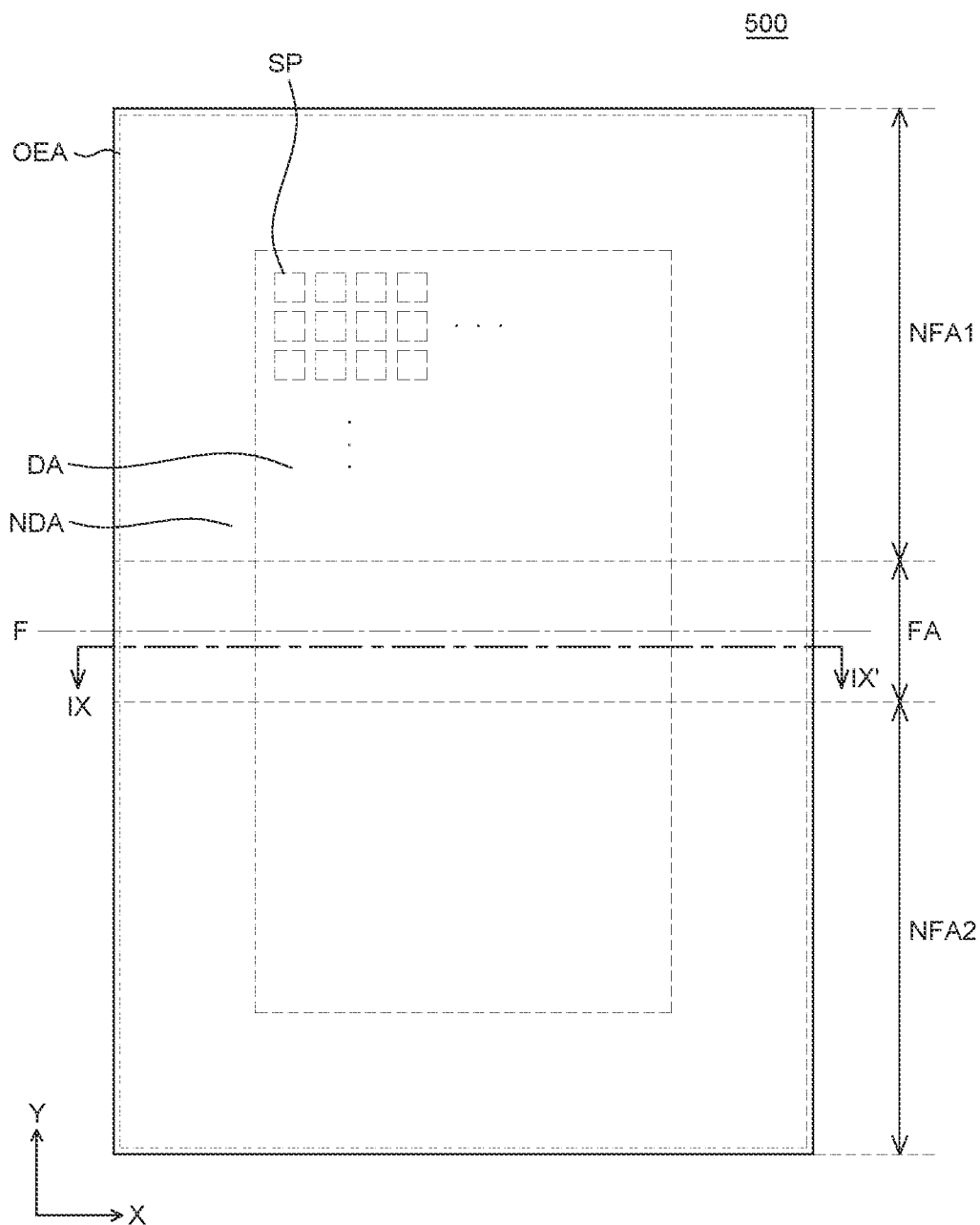
FIG. 8 is a schematic plan view of a foldable display device according to still another exemplary embodiment of the present disclosure.
Figure 9:
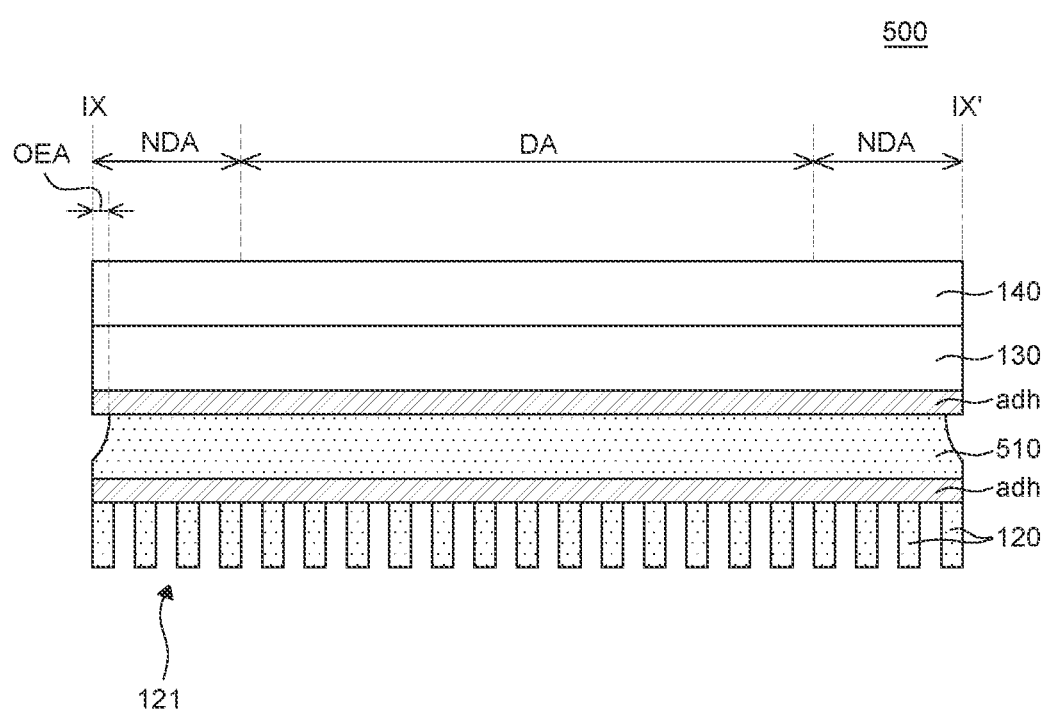
FIG. 9 is a schematic cross-sectional view of the foldable display device as taken along a line IX-IX' of FIG. 8.

FIG. 8 is a schematic plan view of a foldable display device according to still another exemplary embodiment of the present disclosure. FIG. 9 is a schematic cross-sectional view of the foldable display device as taken along a line IX-IX' of FIG. 8.

A foldable display device 500 according to another exemplary embodiment of the present disclosure includes the display panel 130 including the display area DA and the non-display area NDA surrounding the display area DA, and the folding area FA defined in the display area and the non-display area and the non-folding areas NFA1 and NFA2 on both sides of the folding area. Further, the foldable display device 500 includes a first support substrate 510 disposed under the display panel 130 to support the display panel 130 and the second support substrate 120 disposed under the first support substrate 510. The first support substrate 510 includes a central area corresponding to the display area DA and an outer area corresponding to the non-display area NDA. The outer area includes the edge area OEA corresponding to an outermost area of the first support substrate 510. Further, a cross-sectional shape of the edge area OEA increases in width as it gets closer to a lower surface of the first support substrate 510. The foldable display device 500 shown in FIG. 8 and FIG. 9 has substantially the same configuration as the foldable display device 100 shown in FIG. 1 through FIG. 3 except the configuration of the first support substrate 510. Thus, a repeated description will be omitted or may be briefly provided.

Referring to FIG. 8 and FIG. 9, the foldable display device 500 according to another exemplary embodiment of the present disclosure includes the first support substrate 510 and the second support substrate 120. The first support substrate 510 and the second support substrate 120 are disposed under the display panel 130 and support the display panel 130 to suppress sagging or deformation of the display panel 130. Further, the first support substrate 510 and the second support substrate 120 protect the display panel 130 against external impact, moisture or impurities.

The first support substrate 510 can enhance the stiffness of the display panel 130 and function to suppress recognition of the plurality of patterns 121 formed in the second support substrate 120 through the display panel 130.

The first support substrate 510 can be made of an amorphous metal that is excellent in corrosion resistance and elasticity. For example, the first support substrate 510 can contain any one amorphous metal selected from the group consisting of nickel, iron, cobalt, palladium, silicon, magnesium, zirconium, titanium, calcium, copper, platinum, gold and combinations thereof.

Conventionally, a mother substrate made of an amorphous metal has been cut by using sheer force of scissors, a blade or a mold to use the amorphous metal as the first support substrate 510.

However, the amorphous metal has an excellent elasticity but shows brittleness with a high hardness. Therefore, if a first support substrate is prepared using shear force as in the conventional method, a shear band such as microcracks can occur in a cutting plane due to the shear force. Thus, while the foldable display device 500 is folded and unfolded, if a stress is concentrated in an outer area of the first support substrate 510, the microcracks in the shear band or the cracks in the stress-concentrated area can propagate to an inner area. This phenomenon is called fatigue fracture. As a result, the display panel 130 can be degraded in display quality.

Accordingly, according to an exemplary embodiment of the present disclosure, the first support substrate 510 can be prepared by etching a mother substrate made of an amorphous metal at a low temperature without cutting the mother substrate using shear force. Since the first support substrate 510 is prepared by the above-described method, a shear band does not occur in the outermost area of the first support substrate 510.

According to an exemplary embodiment of the present disclosure, as shown in FIG. 8 and FIG. 9, the cross-sectional shape of the edge area OEA corresponding to the outermost area of the first support substrate 510 can increase in width as it gets closer to the lower surface of the first support substrate 510. For example, the first support substrate 510 is prepared through etching at a low temperature, and, thus, the cross-sectional shape of the edge area OEA of the first support substrate 510 can be designed as described above.

If the cross-sectional shape of the edge area OEA of the first support substrate 510 is designed as described above, a shear band does not occur in the edge area OEA of the first support substrate 510. Therefore, even if cracks occur in an edge area of the first support substrate 510, cracks in the edge area caused by the shear band do not propagate into the first support substrate 510.

For example, the width of the edge area OEA of the first support substrate 510 can be equal to or less than 50% of the thickness of the central area of the first support substrate 510.

Further, the first support substrate 510 can further include a plurality of openings in an area corresponding to the non-display area NDA of the folding area FA. Here, a width of the plurality of openings in the extension direction (X-axis) of the folding axis F of the folding area FA can be greater than a width of the plurality of openings in the direction (Y-axis) perpendicular to the extension direction of the folding axis F. For example, if the first support substrate 510 further includes the plurality of openings, the plurality of openings can be further included in the first support substrate 510 when a mother substrate is etched at a low temperature to prepare the first support substrate 510.

If the first support substrate 510 further includes the plurality of openings, stretchability is given to the outer area of the first support substrate 510. Therefore, a folding shape at the outer area of the first support substrate 510 can be induced close to a circular shape so that a folding radius of the first support substrate 510 can be increased.

Furthermore, if the first support substrate 510 further includes the plurality of openings, the edge area of the plurality of openings can have a smaller cross-sectional area than the central area of the first support substrate 510.

Therefore, in the display device 500 according to still another exemplary embodiment of the present disclosure, it is easy to suppress occurrence of a shear band in the edge area of the first support substrate 510. Thus, even if cracks occur in the edge area OEA of the first support substrate 510 when the first support substrate 510 is repeatedly folded, the cracks do not penetrate into the first support substrate 510 from the edge area OEA of the first support substrate 510. For example, the cracks do not penetrate to the display area DA. Further, if the first support substrate 510 further includes the plurality of openings, it is possible to more easily disperse a stress concentrated in the outer area and inside the first support substrate 510 even when first support substrate 510 is repeatedly folded. Therefore, it is possible to suppress occurrence of cracks in the first support substrate 510.

Hereinafter, the above-described effects of the present disclosure will be described in detail with reference to Embodiments and Comparative Embodiment. However, the following Embodiments are provided for the purpose of illustration, but do not limit the scope of the present disclosure.

To investigate the effects of the present disclosure, six (6) first support substrate samples were prepared by cutting a sheet of amorphous metal foil with scissors into, and these samples were used as Comparative Embodiment.

Meanwhile, six (6) first support substrate samples were prepared by etching a sheet of amorphous metal foil. In each of three of the six first support substrate samples prepared by etching the amorphous metal foil, a plurality of openings each having an oval shape was formed corresponding to a non-display area of a folding area of the first support substrate as illustrated in FIG. 4. These samples were used as Embodiment 1.

Further, in each of the other three of the six first support substrate samples prepared by etching the amorphous metal foil, no opening was formed in a folding area. These samples were used as Embodiment 2.

200,000 cycles of folding test under each of folding radius conditions of 1.5 mm and 2.0 mm was performed to the samples of Embodiments 1 and 2 and Comparative Embodiment. It was checked whether each of Embodiments and Comparative Embodiment passed the folding test under each of the folding radius conditions, i.e., whether propagation of cracks occurred in each first support substrate sample after 200,000 cycles of folding test. The numbers of first support substrate samples without propagation of cracks among the samples of Embodiments and Comparative Embodiment, respectively, are listed in Table 1.

TABLE 1

| Folding radius (R) | Number of samples passing folding test (pass) | | |
|---|---|---|---|
| | Embodiment 1 | Embodiment 2 | Comparative Embodiment |
| 2.0 mm | 3/3 | 3/3 | 2/6 |
| 1.5 mm | 3/3 | 2/3 | 0/6 |

As listed in Table 1, it can be seen that the support substrates of Embodiments 1 and 2 passed 200,000 cycles of folding test under the folding radius conditions of 2.0 mm and 1.5 mm.

However, any etching process was not performed to the first support substrates of Comparative Embodiment, and, thus, a shear band occurred in edge areas of the first support substrates. Therefore, not all of the first support substrates could not pass 200,000 cycles of folding test under each of the folding radius conditions of 2.0 mm and 1.5 mm.

The exemplary embodiments of the present disclosure can also be described as follows:

According to an aspect of the present disclosure, a foldable display device including a display panel including a display area and a non-display area surrounding the display area, where a folding area is defined in the display area and the non-display area, and non-folding areas are defined on both sides of the folding area; a first support substrate disposed under the display panel to support the display panel and including a plurality of openings disposed in an area corresponding to the non-display area of the folding area; and a second support substrate disposed under the first support substrate, wherein a width of the plurality of openings in an extension direction of a folding axis of the folding area is greater than a width of the plurality of openings in a direction perpendicular to the extension direction of the folding axis.

Each of the plurality of openings can have an oval shape.

The plurality of openings can increase in size as a distance to the display area decreases.

The first support substrate includes a plurality of grooves recessed inwardly in an edge of the non-display area of the folding area, and the plurality of grooves can correspond in shape to the plurality of openings.

The first support substrate includes a central area corresponding to the display area and an outer area corresponding to the non-display area, and the outer area can be folded with a greater folding radius than the central area.

The first support substrate includes a central area corresponding to the display area and an outer area corresponding to the non-display area, and the outer area includes an edge area corresponding to an outermost area of the first support substrate, and a cross-sectional shape of the edge area can increase in width as it gets closer to a lower surface of the first support substrate.

The edge area can have a smaller thickness than the central area of the first support substrate.

A width of the edge area can be equal to or less than 50% of a thickness of the central area of the first support substrate.

The plurality of openings includes an edge area corresponding to an outermost area of the plurality of openings, and the edge area of the plurality of openings can have a smaller cross-sectional area than a central area of the first support substrate.

A cross-sectional thickness of the edge area of the plurality of openings can be equal to or less than 50% of a thickness of the central area of the first support substrate.

The first support substrate can contain any one amorphous metal selected from the group consisting of nickel, iron, cobalt, palladium, silicon, magnesium, zirconium, titanium, calcium, copper, platinum, gold and combinations thereof.

The second support substrate can include a plurality of patterns formed corresponding to the folding area.

According to another aspect of the present disclosure, a foldable display device including a display panel including a display area and a non-display area surrounding the display area, where a folding area is defined in the display area and the non-display area, and non-folding areas are defined on both sides of the folding area; a first support substrate disposed under the display panel to support the display panel; and a second support substrate disposed under the first support substrate, wherein the first support substrate includes a central area corresponding to the display area and an outer area corresponding to the non-display area, and the outer area includes an edge area corresponding to an outermost area of the first support substrate, and a cross-sectional shape of the edge area increases in width as it gets closer to a lower surface of the first support substrate.

The first support substrate can include a plurality of openings which is disposed in an area corresponding to the non-display area of the folding area and in which a width of the plurality of openings in an extension direction of a folding axis of the folding area is greater than a width of the plurality of openings in a direction perpendicular to the extension direction of the folding axis.

The plurality of openings includes an edge area corresponding to an outermost area of the plurality of openings, and the edge area of the plurality of openings can have a smaller cross-sectional area than the central area of the first support substrate.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto.

Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A foldable display device, comprising:
    a display panel including a display area and a non-display area surrounding the display area,
    wherein the display panel is divided into a folding area including a part of the display area and a part of the non-display area, and non-folding areas are defined on both sides of the folding area;
    a first support substrate disposed under the display panel to support the display panel, and including a plurality of openings disposed in an area corresponding to the part of the non-display area of the folding area; and
    a second support substrate disposed under the first support substrate,
    wherein a width of the plurality of openings in an extension direction of a folding axis of the folding area is greater than a width of the plurality of openings in a direction perpendicular to the extension direction of the folding axis, and
    wherein the first support substrate is a metal layer disposed closest to the display panel under the display panel.

2. The foldable display device according to claim 1, wherein each of the plurality of openings has an oval shape.

3. The foldable display device according to claim 1, wherein the first support substrate includes:
    a central area corresponding to the display area, and
    an outer area corresponding to the non-display area, and
    wherein the outer area is folded with a greater folding radius than the central area.

4. The foldable display device according to claim 1, wherein the first support substrate includes:
    a plurality of grooves recessed inwardly in an edge of the part of the non-display area of the folding area, and
    the plurality of grooves corresponds in shape to the plurality of openings.

5. The foldable display device according to claim 1, wherein the plurality of openings increases in size as a distance to the display area decreases.

6. The foldable display device according to claim 1, wherein the first support substrate includes:
    a central area corresponding to the display area, and
    an outer area corresponding to the non-display area,
    wherein the outer area includes an edge area corresponding to an outermost area of the first support substrate, and
    wherein a cross-sectional shape of the edge area increases in width as it gets closer to a lower surface of the first support substrate.

7. The foldable display device according to claim 6, wherein the edge area has a smaller thickness than the central area of the first support substrate.

8. The foldable display device according to claim 6, wherein a width of the edge area is equal to or less than 50% of a thickness of the central area of the first support substrate.

9. The foldable display device according to claim 1, wherein the plurality of openings includes an edge area corresponding to an outermost area of the plurality of openings, and
    wherein the edge area of the plurality of openings has a smaller cross-sectional area than a central area of the first support substrate.

10. The foldable display device according to claim 9, wherein a cross-sectional thickness of the edge area of the plurality of openings is equal to or less than 50% of a thickness of the central area of the first support substrate.

11. The foldable display device according to claim 1, wherein the first support substrate contains any one amorphous metal selected from the group consisting of nickel, iron, cobalt, palladium, silicon, magnesium, zirconium, titanium, calcium, copper, platinum, gold and combinations thereof.

12. The foldable display device according to claim 1, wherein the second support substrate includes a plurality of patterns corresponding to the folding area.

13. The foldable display device according to claim 1, wherein the second support substrate includes nickel, iron, aluminum, or magnesium.

14. The foldable display device according to claim 1, wherein the second support substrate includes polymethylmethacrylate (PMMA), polycarbonate (PC), polyvinylalcohol (PVA), acrylonitrile-butadiene-styrene (ABS), polyethylene terephthalate (PET), silicone, or polyurethane (PU).

15. The foldable display device according to claim 1, wherein a portion of the first support substrate corresponding to the display area is uninterrupted by the plurality of openings.

16. The foldable display device according to claim 1, wherein the first support substrate directly contacts the display panel.

* * * * *